United States Patent
Oda et al.

(10) Patent No.: US 6,613,635 B2
(45) Date of Patent: Sep. 2, 2003

(54) METHOD OF FABRICATING SEMICONDUCTOR DEVICE HAVING ELEMENT ISOLATION TRENCH

(75) Inventors: Masahiro Oda, Takatsuki (JP); Kazuhiro Sasada, Hashima (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/015,756

(22) Filed: Dec. 17, 2001

(65) Prior Publication Data

US 2002/0086498 A1 Jul. 4, 2002

(30) Foreign Application Priority Data

Dec. 28, 2000  (JP) ........................................ 2000-402693

(51) Int. Cl.[7] ............................................. H01L 21/336
(52) U.S. Cl. ...................... 438/294; 438/199; 438/232; 438/514; 438/522; 438/525
(58) Field of Search ................................. 438/199, 221, 438/223, 224, 232, 294, 296, 424, 425, 427, 433, 435, 437, 514, 522, 524, 525, 527

(56) References Cited

U.S. PATENT DOCUMENTS 5,795,801 A  *  8/1998  Lee .............................. 438/199
6,090,684 A  *  7/2000  Ishitsuka et al. ............ 438/424

FOREIGN PATENT DOCUMENTS

| JP | 11-40662 | 2/1999 |
| JP | 2000-150878 | 5/2000 |

OTHER PUBLICATIONS

Ryssel and Ruge, "Ion Implantation", Chapter 3, paragraph 3.9.1, p 95, John Wiley, 1986.*

* cited by examiner

Primary Examiner—Kamand Cuneo
Assistant Examiner—Asok Kumar Sarkar
(74) Attorney, Agent, or Firm—McDermott, Will & Emery

(57) ABSTRACT

Threshold voltage fluctuation in upper corner portions of a trench isolation is inhibited by rounding upper corner portions of the trench by thermal oxidation, introducing a first impurity into both upper corner portions of the trench and heat-treating the semiconductor substrate. Embodiments include increasing the threshold voltage in the upper corner portion of the trench in an n-channel transistor, previously increased by rounding oxidation, and introducing a p-type impurity, thereby canceling the threshold voltage reduction resulting from diffusion of the impurity during heat-treating the semiconductor substrate. In a p-channel transistor, the threshold voltage in the upper corner portion of the trench is increased by rounding oxidation thereby canceling the threshold voltage reduction resulting from introduction of the p-type first impurity into both upper corner portions of the trench.

14 Claims, 5 Drawing Sheets nMOSFET REGION   pMOSFET REGION nMOSFET REGION   pMOSFET REGION nMOSFET REGION   pMOSFET REGION

METHOD OF FABRICATING SEMICONDUCTOR DEVICE HAVING ELEMENT ISOLATION TRENCH

BACKGROUND OF THE INVENTION

1. Field of the Invention

The present invention relates to a method of fabricating a semiconductor device, and more particularly, it relates to a method of fabricating a semiconductor device having an element isolation trench.

2. Description of the Prior Art

In recent years, further reduction of a design rule is studied in order to improve the degree of integration and the speed of a semiconductor device. At present, prototypes of a 256-M DRAM (Dynamic Random Access Memory) and a CMOS (Complementary Metal Oxide Semiconductor) transistor having a gate length of 0.1 µm are opened to the public. Following such progress of refinement of the transistor, reduction of the device size according to a scaling law and following increase of the operating speed are expected.

In relation to miniaturization of the device, it is extremely important to improve an element isolation technique for isolating refined transistors from each other in addition to refinement of the transistor.

In general, the LOCOS (local oxidation of silicon) method is employed for element isolation. In the LOCOS method, however, the element isolation width cannot be sufficiently reduced due to lateral spreading (bird's beak) of a silicon oxide film for isolating elements from each other by oxidation isolation.

To this end, STI (shallow trench isolation) of forming a trench for element isolation between elements and embedding a silicon oxide film in the trench thereby isolating the elements from each other is proposed.

When STI is employed, the element isolation width is not limited by a bird's beak dissimilarly to the LOCOS method, whereby the device can be further refined.

When STI is employed, however, an upper corner portion of the trench is sharply shaped as compared with that in the LOCOS method. When a transistor is fabricated, therefore, an electric field from a gate electrode to a channel region concentrates on the upper corner portion of the trench, to disadvantageously reduce a threshold voltage in the upper corner portion of the trench. Further, a leakage current disadvantageously readily flows through the portion having the reduced threshold voltage.

A method of suppressing field concentration on the upper corner portion of the trench by rounding this upper corner portion is known as a method of avoiding the aforementioned problems caused in the STI. Also when reduction of the threshold voltage caused by field concentration is suppressed, however, the threshold voltage disadvantageously fluctuates due to diffusion of an impurity in the upper corner portion of the trench. In an nMOSFET, for example, boron serving as a p-type impurity is generally implanted into a channel region. This boron diffuses out toward a silicon oxide film embedded in the trench and a silicon oxide film formed by rounding the upper corner portion of the trench, and hence the boron concentration is reduced in the upper corner portion of the trench. Consequently, the threshold voltage is partially reduced in the upper corner portion of the trench.

For example, Japanese Patent Laying-Open No. 2000-150878 discloses a technique for suppressing reduction of a threshold voltage resulting from diffusion of an impurity. In a method of fabricating a semiconductor device proposed in this gazette, a trench for element isolation is first formed on a semiconductor substrate. An impurity of the same conductivity type as that for forming a channel region is obliquely ion-implanted into the main surface of the semiconductor substrate. Thus, the impurity sufficiently remains in the edge of the channel region (the upper corner portion of the trench) even upon out diffusion of the impurity, and hence reduction of the threshold voltage can be suppressed.

However, this proposed technique has the following problems:

Consider that the aforementioned proposed technique is applied to a CMOS transistor having a first conductivity type channel region and a second conductivity type channel region on a substrate. In this case, when the first conductivity type impurity is ion-implanted into the first conductivity type channel region, an ion implantation mask such as a resist mask must be formed on the second conductivity type channel region, in order to ion-implant impurities of the same conductivity types as the channel regions.

However, an end of the ion implantation mask blocks the impurity when the same is obliquely implanted into the channel region located on the inner side surface of the trench through the ion implantation mask. Thus, it is difficult to sufficiently implant the impurity into the channel region. In other words, it is difficult to implant the impurity into the channel region when the ion implantation mask shades the channel region. Particularly when elements are refined, the end of the ion implantation mask so approaches the channel region subjected to ion implantation that the channel region is readily shaded by the ion implantation mask.

The impurity may alternatively be implanted into the overall surface of the trench without through the ion implantation mask. However, when first conductivity type impurity ions are implanted into the overall surface of the trench in order to suppress reduction of the threshold voltage caused by diffusion of the impurity in the upper corner portion of the first conductivity type channel region, for example, the first conductivity type impurity is inevitably also implanted into the second conductivity type channel region. In the upper corner portion of the second conductivity type channel region, therefore, the action of the impurity is canceled and the threshold voltage is reduced. Consequently, a leakage current disadvantageously readily flows through the portion having the reduced threshold voltage.

As hereinabove described, it is generally difficult to suppress fluctuation of the threshold voltage in the upper corner potion of the trench isolating the first conductivity type channel region and the second conductivity type channel region from each other.

SUMMARY OF THE INVENTION

An object of the present invention is to provide a method of fabricating a semiconductor device capable of suppressing fluctuation of a threshold voltage in an upper corner portion of a trench isolating a first conductivity type channel region and a second conductivity type channel region from each other.

Another object of the present invention is to reliably introduce a first impurity into the upper corner portion of the trench in the aforementioned method of fabricating a semiconductor device.

A method according to a first aspect of the present invention is a method of fabricating a semiconductor device including a first transistor having a first conductivity type channel region and a second transistor having a second conductivity type channel region, comprising steps of forming a trench for isolating the first transistor and the second transistor from each other on a semiconductor substrate, rounding upper corner portions of the trench by thermal oxidation, introducing a first impurity into both upper corner portions of the trench, introducing a second impurity into a region for defining the first conductivity type channel region, introducing a third impurity into a region for defining the second conductivity type channel region and heat-treating the semiconductor substrate. According to the present invention, the term "semiconductor substrate" indicates a wide concept including not only an ordinary semiconductor substrate but also a semiconductor layer formed on an insulating substrate or the like.

In the method of fabricating a semiconductor device according to the first aspect, the first impurity is introduced into both upper corner portions of the trench after rounding the upper corner portions of the trench by thermal oxidation as described above, whereby the threshold voltage in the upper corner potion of the trench can be previously increased by rounding oxidation and introduction of a p-type impurity in an n-channel transistor when employing the p-type impurity as the first impurity, for example. Reduction of the threshold voltage in the upper corner portion of the trench resulting from diffusion of an impurity for heat-treating the semiconductor substrate can be canceled due to this increase of the threshold voltage. In the n-channel transistor, therefore, the threshold voltage can be effectively inhibited from fluctuation in the upper corner portion of the trench. Consequently, it is possible to suppress increase of a leakage current caused by reduction of the threshold voltage of the n-channel transistor in the upper corner portion of the trench.

In a p-channel transistor, the threshold voltage in the upper corner portion of the trench can be previously increased by rounding oxidation. Thus, it is possible to cancel reduction of the threshold voltage caused by introducing the p-type first impurity into both upper corner portions of the trench, whereby the threshold voltage can be effectively inhibited from fluctuation in the upper corner portion of the trench. Consequently, it is possible to suppress increase of a leakage current caused by reduction of the threshold voltage of the p-channel transistor in the upper corner potion of the trench.

Further, the first impurity is introduced into both upper corner portions of the trench so that the region subjected to ion implantation may not be limited through an ion implantation mask such as a resist mask, whereby no region is shaded by such an ion implantation mask when the first impurity is introduced. Thus, the first impurity can be reliably introduced into both upper corner portions of the trench. Further, no step of forming an ion implantation mask is necessary, whereby the fabrication process can be simplified.

In the method of fabricating a semiconductor device according to the aforementioned first aspect, the step of forming the trench preferably includes steps of forming a first mask layer on a prescribed region of the semiconductor substrate and forming the trench by etching the semiconductor substrate through the first mask layer serving as a mask, and the step of introducing the first impurity preferably includes a step of introducing the first impurity into both upper corner portions of the trench while leaving the first mask layer. According to this structure, the first impurity can be prevented from being implanted into regions other than ends (the upper corner portions of the trench) of channel regions.

In this case, the step of introducing the first impurity preferably includes a step of implanting the first impurity into both upper corner portions of the trench obliquely to the main surface of the semiconductor substrate while leaving the first mask layer. According to this structure, the first impurity can be readily implanted into the upper corner potions of the trench. In this case, the first mask layer preferably includes a silicon nitride film.

In the method of fabricating a semiconductor device according to the aforementioned first aspect, the step of introducing the first impurity preferably includes a step of implanting the first impurity into both upper corner portions of the trench with implantation energy for locating a peak of impurity concentration in the vicinity of the surface of the semiconductor substrate. According to this structure, the first impurity can be readily prevented from being implanted into central portions of the channel regions.

In the method of fabricating a semiconductor device according to the aforementioned first aspect, the first impurity introduced into both upper corner portions of the trench may include boron.

In the method of fabricating a semiconductor device according to the aforementioned first aspect, the step of forming the trench preferably includes steps of forming a first mask layer on a prescribed region of the semiconductor substrate and forming the trench by etching the semiconductor substrate through the first mask layer serving as a mask, and the method preferably further comprises a step of forming an insulator in the trench and on the semiconductor substrate and thereafter polishing the upper surface of the insulator through the first mask layer serving as a stopper thereby embedding the insulator in the trench. According to this structure, the insulator can be readily embedded in the trench.

In the method of fabricating a semiconductor device according to the aforementioned first aspect, the step of heat-treating the semiconductor substrate preferably includes a step of heat-treating the semiconductor substrate at a temperature of about 700° C. to about 1100° C. In this case, the step of heat-treating the semiconductor substrate preferably includes a step of performing heat treatment by rapid heating. According to this structure, the impurity can be readily activated by this heat treatment.

In the method of fabricating a semiconductor device according to the aforementioned first aspect, the step of rounding the upper corner portions of the trench preferably includes a step of rounding the upper corner portions of the trench by forming a thermal oxide film of about 50 nm to about 600 nm at a temperature of about 1000° C. to about 1200° C. When the heat treatment is performed under such conditions, the upper corner portions of the trench can be sufficiently rounded.

In the method of fabricating a semiconductor device according to the aforementioned first aspect, the second impurity preferably includes boron, and the third impurity preferably includes arsenic or phosphorus.

In the method of fabricating a semiconductor device according to the aforementioned first aspect, the step of introducing the second impurity into the region for defining the first conductivity type channel region preferably includes steps of forming a second mask layer to cover a region formed with the second transistor having the second conductivity type channel region and implanting the second impurity into the region for defining the first conductivity channel region through the second mask layer serving as a mask. According to this structure, the second impurity can be implanted only into the region for defining the first conductivity type channel region.

In the method of fabricating a semiconductor device according to the aforementioned first aspect, the step of introducing the third impurity into the region for defining the second conductivity type channel region preferably includes steps of forming a third mask layer to cover a region formed with the first transistor having the first conductivity type channel region and implanting the third impurity into the region for defining the second conductivity type channel region through the third mask layer serving as a mask. According to this structure, the third impurity can be implanted only into the region for defining the second conductivity type channel region.

A method according to a second aspect of the present invention is a method of fabricating a semiconductor device including a first transistor having a first conductivity type channel region and a second transistor having a second conductivity type channel region, comprising steps of successively depositing a silicon oxide film and a silicon nitride film on a semiconductor substrate, forming a resist mask on a prescribed region of the silicon nitride film, patterning the silicon nitride film and the silicon oxide film through the resist mask, forming a trench for isolating the first transistor and the second transistor from each other by etching the semiconductor substrate through the patterned silicon nitride film serving as a mask, rounding upper corner portions of the trench by thermal oxidation, implanting a first impurity into both upper corner portions of the trench through the silicon nitride film serving as a mask, introducing a second impurity into a region for defining the first conductivity channel region, introducing a third impurity into a region for defining the second conductivity type channel region and heat-treating the semiconductor substrate.

In the method of fabricating a semiconductor device according to the second aspect, the first impurity is introduced into both upper corner portions of the trench after rounding the upper corner portions of the trench by thermal oxidation as described above, whereby the threshold voltage in the upper corner potion of the trench can be previously increased by rounding oxidation and introduction of a p-type impurity in an n-channel transistor when employing the p-type impurity as the first impurity, for example. Reduction of the threshold voltage in the upper corner portion of the trench resulting from diffusion of an impurity for heat-treating the semiconductor substrate can be canceled due to this increase of the threshold voltage. In the n-channel transistor, therefore, the threshold voltage can be effectively inhibited from fluctuation in the upper corner portion of the trench. Consequently, it is possible to suppress increase of a leakage current caused by reduction of the threshold voltage of the n-channel transistor in the upper corner portion of the trench.

In a p-channel transistor, the threshold voltage in the upper corner portion of the trench can be previously increased by rounding oxidation. Thus, it is possible to cancel reduction of the threshold voltage caused by introducing the p-type first impurity into the upper corner portions of the trench, whereby the threshold voltage can be effectively inhibited from fluctuation in the upper corner portion of the trench. Consequently, it is possible to suppress increase of a leakage current caused by reduction of the threshold voltage of the p-channel transistor in the upper corner potion of the trench.

Further, the first impurity is introduced into both upper corner portions of the trench so that the region subjected to ion implantation may not be limited through an ion implantation mask such as a resist mask, whereby no region is shaded by such an ion implantation mask when the first impurity is introduced. Thus, the first impurity can be reliably introduced into both upper corner portions of the trench.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
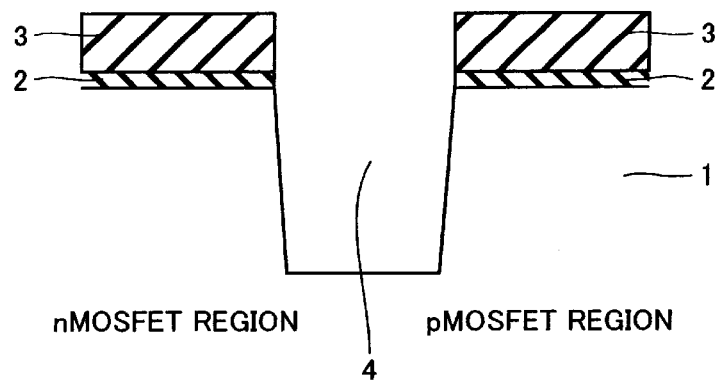
FIGS. 1 to 9 are sectional views for illustrating a process of fabricating a semiconductor device according to an embodiment of the present invention.

An embodiment of the present invention is now described with reference to the drawings.

First, a method of fabricating a semiconductor device according to this embodiment is described with reference to FIGS. 1 to 9.

Step 1 (see FIG. 1): A silicon oxide film 2 of about 10 nm in thickness and a silicon nitride film 3 of about 50 nm to about 200 nm in thickness are successively formed on the main surface of a p-type single-crystalline silicon substrate 1. A resist film (not shown) is applied onto the silicon nitride film 3, and thereafter patterned. The patterned resist film is employed as a mask for patterning the silicon nitride film 3 and the silicon oxide film 2 by etching. Thereafter the resist film is removed. The patterned silicon nitride film 3 is employed as a mask for etching the p-type single-crystalline silicon substrate 1, thereby forming a trench 4 for element isolation. An nMOSFET is formed on the left side of the trench 4, while a pMOSFET is formed on the right side of the trench 4. The p-type single-crystalline silicon substrate 1 is an example of the "semiconductor substrate" according to the present invention.

Step 2 (see FIG. 2): Heat treatment is performed for forming a silicon oxide film 5 along the inner surface of the trench 4 with a thickness of about 50 nm to about 600 nm, thereby rounding upper corner portions 4a of the trench 4. This rounding oxidation is performed under a temperature condition within the range of about 1000° C. to about 1200° C. In order to round the upper corner portions 4a, the rate of oxidation is preferably decided in response to the state of diffusion of the oxidation species. In other words, oxidation is preferably performed by diffusion-controlled reaction of the oxidation species. Thus, an oxidation species having a low diffusion coefficient is preferably selected while increasing the oxidation temperature. In a low-temperature stage during temperature rise, therefore, the oxygen concentration is preferably suppressed to minimize the possibility of oxidation while dry oxidation employing $O_2$ having a small diffusion coefficient as the oxidation species is preferably employed.

Step 3 (see FIG. 3): While leaving the silicon nitride film 3, boron is ion-implanted into the overall surface of the trench 4 at an angle of 20° to 70° with respect to a direction perpendicular to the main surface of the p-type single-crystalline silicon substrate 1 from four to eight directions. In other words, ion implantation is performed from directions for sufficiently implanting boron into both upper corner portions 4a of the trench 4. In this case, low implantation energy is employed for locating the concentration peak of the implanted impurity on the surface (the upper corner portions 4a of the trench 4) of the p-type single-crystalline silicon substrate 1. This implantation energy is about 10 keV to about 30 keV, for example. The injection rate is about $5\times10^{11}$ cm$^{-2}$ to about $1\times10^{14}$ cm$^{-2}$. When the injection rate is more than $5\times10^{12}$ cm$^{-2}$, a junction leakage current is remarkably increased. Therefore, the injection rate is preferably not more than about $5\times10^{12}$ cm$^{-2}$ in order to suppress the increase of the junction leakage current.

Step 4 (see FIG. 4): A silicon oxide film 6 is embedded in the trench 4 by CVD and thereafter heat treated at about 900° C. to about 1200° C. for about one minute to about 30 minutes, thereby stabilizing the film quality of the silicon oxide film 6.

Step 5 (see FIG. 5): An unnecessary portion of the silicon oxide film 6 is removed by CMP (chemical mechanical polishing) through the silicon nitride film 3 serving as a stopper.

Figure 6:
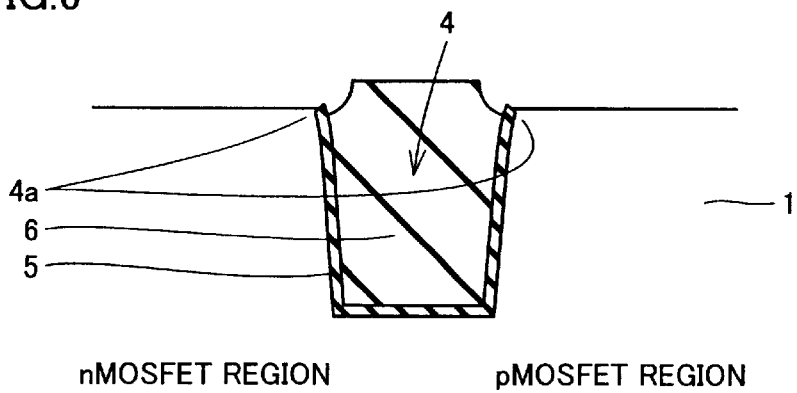
Figure 7:
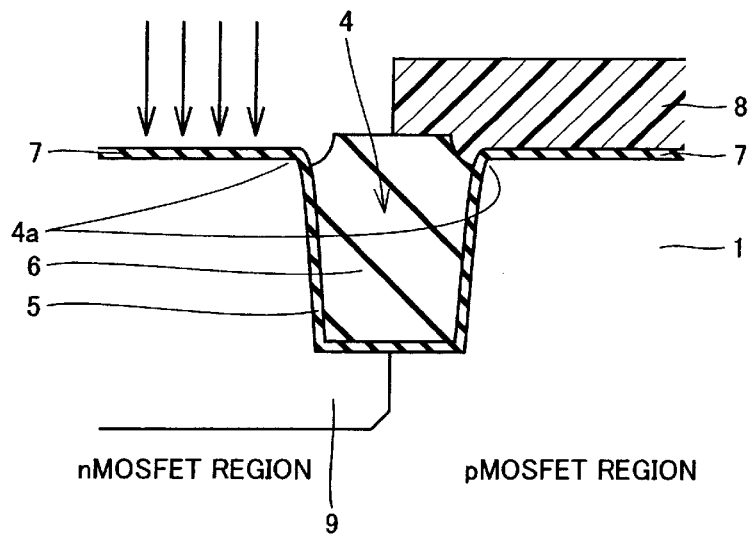
Figure 8:
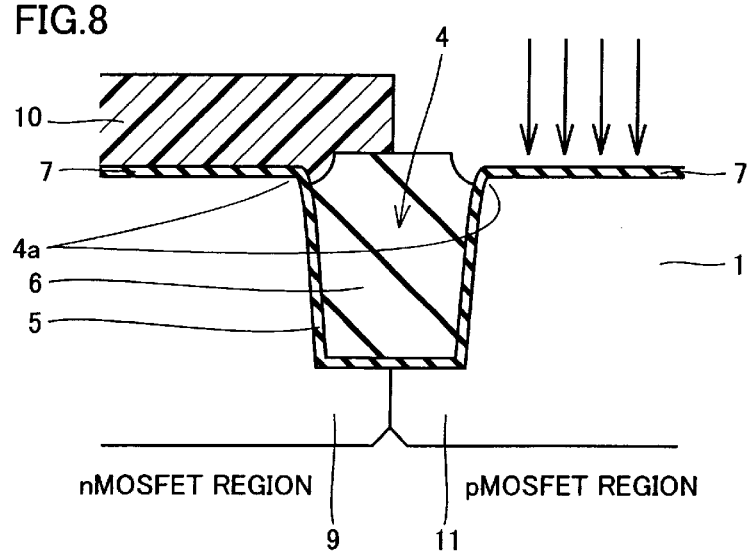
Figure 9:
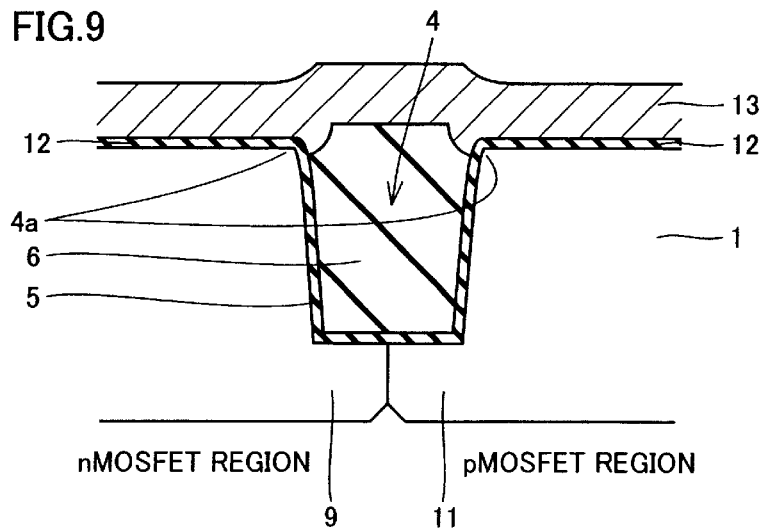

Step 6 (see FIG. 6): The silicon nitride film 3 and the silicon oxide film 2 are removed by wet etching. The silicon oxide film 6 formed by CVD, having a higher etching rate than the silicon oxide film 2 formed by thermal oxidation, is depressed in the upper corner portions 4a of the trench 4, as shown in FIG. 6.

Step 7 (see FIG. 7): A silicon oxide film 7 is formed by thermal oxidation for defining an ion implantation protective film. Thereafter an ion implantation mask 8 is formed to cover the region for forming the pMOSFET. Boron (B) is ion-implanted into the region for forming the nMOSFET through the ion implantation mask 8, thereby forming a p-type channel region 9. Thereafter the ion implantation mask 8 is removed.

Step 8 (see FIG. 8): Another ion implantation mask 10 is formed to cover the nMOSFET region. Arsenic (As) is ion-implanted into the region for forming the pMOSFET through the ion implantation mask 10, thereby forming an n-type channel region 11. Thereafter the ion implantation mask 10 is removed.

Step 9 (see FIG. 9): The silicon oxide film 7 is removed by wet etching, followed by formation of a gate oxide film 12 consisting of silicon oxide by thermal oxidation. The thermal oxidation temperature for forming the gate oxide film 12 is about 800° C. to about 900° C. Then, a polycrystalline silicon film (not shown) is deposited on the overall surface and thereafter patterned, thereby forming a gate electrode 13. Thereafter arsenic (As) is ion-implanted into the nMOSFET region while ion-implanting boron (B) into the pMOSFET region, thereby forming source/drain regions (not shown). Then, heat treatment is performed at about 700° C. to about 1100° C. for about 0.1 seconds to about 30 seconds by RTA (rapid thermal annealing), thereby activating the impurities in the source/drain regions.

Boron contained in the upper corner portions 4a of the trench 4 diffuses out toward the gate oxide film 12 due to the heat treatment for forming the gate oxide film 12 and the heat treatment by RTA for activating the source/drain regions, whereby the concentration of boron is reduced in the upper corner portions 4a of the trench 4.

Figure 2:
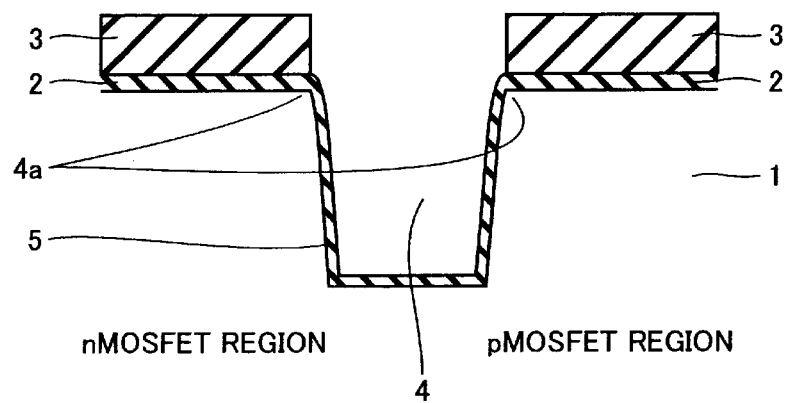
Figure 10A:
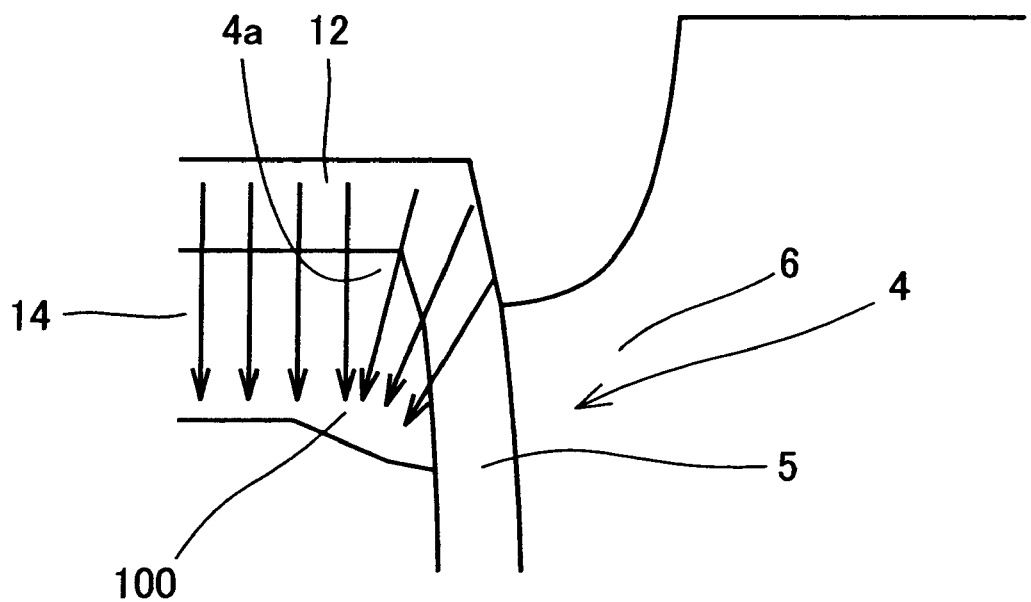
FIGS. 10A and 10B are model diagrams for illustrating that transverse spreading of a depletion layer on an upper corner portion of a trench is increased due to rounding oxidation.
Figure 10B:
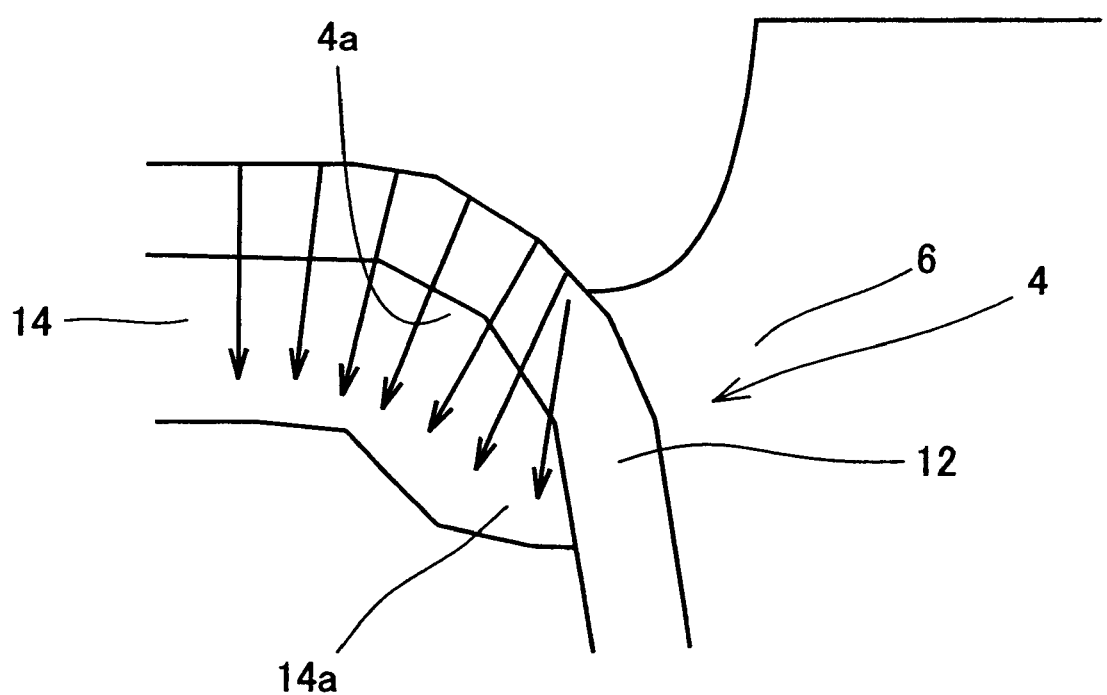

An effect of rounding oxidation in the step 2 shown in FIG. 2 is now described with reference to FIGS. 10A and 10B. According to this embodiment, the upper corner portions 4a of the trench 4 are rounded in the step 2 shown in FIG. 2, thereby changing field distribution from the gate electrode 13 toward each upper corner portion 4a of the trench 4. Such change of the field distribution is now described with reference to FIGS. 10A and 10B. FIG. 10A shows a state before rounding oxidation, and FIG. 10B shows a state after rounding oxidation. Referring to FIGS. 10A and 10B, arrows show electric fields.

When no rounding oxidation is performed, remarkable field concentration takes place in a region 100 as shown in FIG. 10A. Therefore, the threshold voltage is reduced in this region 100. When rounding oxidation is performed, on the other hand, each upper corner portion 4a of the trench 4 is rounded as shown in FIG. 10B, and hence field concentration is reduced. A depletion layer 14 transversely spreads in a region 14a when rounded oxidation is performed, and hence a large number of depletion charges are required for inverting the channel. Therefore, the threshold voltage is increased in this portion. Thus, the threshold voltages of the nMOSFET and the pMOSFET are increased in the stage of the step 2 shown in FIG. 2.

After the rounding oxidation in the aforementioned step 2, boron employed as the p-type impurity is ion-implanted into both upper corner portions 4a of the trench 4 in the step 3 (see FIG. 3) in this embodiment. According to this ion implantation of boron, the concentration of boron is increased in the p-type channel region 9 in the left upper corner portion 4a of the trench 4 forming the nMOSFET. Thus, the p-type impurity concentration is increased in the p-type channel region 9, thereby increasing the threshold voltage of the nMOSFET. On the other hand, boron employed as the p-type impurity cancels the action of arsenic (As) employed as the n-type impurity forming the channel region 11 of the pMOSFET in the right upper corner portion 4a of the trench 4 forming the pMOSFET, thereby reducing the threshold voltage. In the stage of the step 3, therefore, the threshold voltage of the nMOSFET is increased while that of the pMOSFET is reduced.

Thereafter boron forming the channel region 9 of the nMOSFET diffuses out toward the gate oxide film 12 due to the heat treatment for forming the gate oxide film 12 and the heat treatment by RTA for activating the source/drain regions, whereby the threshold voltage is reduced in the nMOSFET. Thus, increase of the threshold voltage in the steps 2 and 3 and reduction thereof in the step 9 are canceled in the nMOSFET. Consequently, the threshold voltage of the nMOSFET can be inhibited from fluctuation. On the other hand, the amount of boron canceling the action of arsenic (As) employed as the n-type impurity is reduced by out diffusion due to the heat treatment for forming the gate oxide film 12 in the step 9 and the heat treatment by RTA for activating the source/drain regions. Thus, the threshold voltage of the pMOSFET is increased to cancel the reduction of the threshold voltage in the step 3. Therefore, the threshold voltage of the pMOSFET can be inhibited from fluctuation.

In order to suppress fluctuation of the threshold voltages in this embodiment, it is necessary to adjust the relation between the rounded states of the upper corner portions 4a of the trench 4 resulting from rounding oxidation in the step 2, the injection rate of the impurity (boron) in the step 3 and the impurity diffusion state of boron in the step 9. In other words, the aforementioned relation must be adjusted to reduce the increase of the threshold voltage in the steps 2 and 3 and the reduction thereof in the step 9 in the nMOSFET. Further, the aforementioned relation must be adjusted to cancel the increase of the threshold voltage in the steps 2 and 9 and the reduction thereof in the step 3 in the pMOSFET.

Consider the relation between the rounded states of the upper corner portions 4a of the trench 4 in the step 2 and the amounts of fluctuation of the threshold voltages. The rounded states of the upper corner portions 4a can be varied with the thickness of the rounded oxide film 5, and hence the amounts of fluctuation of the threshold voltages are measured with reference to the thickness of the rounded oxide film 5. The difference (ΔVt) between the threshold voltages of a transistor having a sufficiently large gate width and a target transistor having a small gate width may be measured as to the amounts of fluctuation of the threshold voltages.

Figure 11:
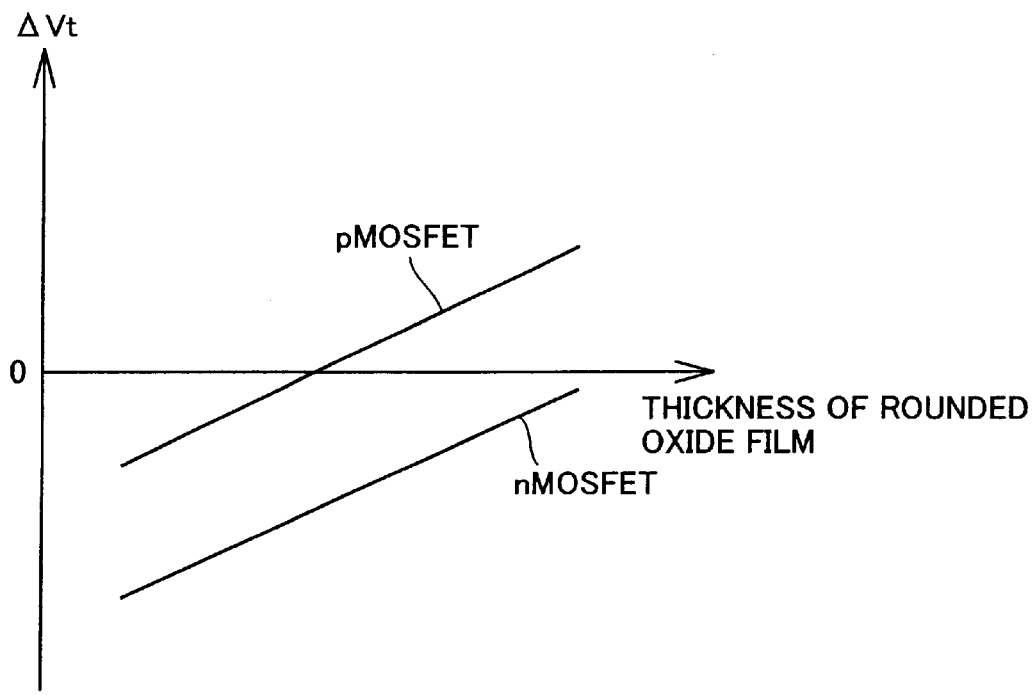
FIG. 11 is a graph showing the correlation between the thickness of a rounded oxide film and the quantity of fluctuation of a threshold voltage.
Figure 12:
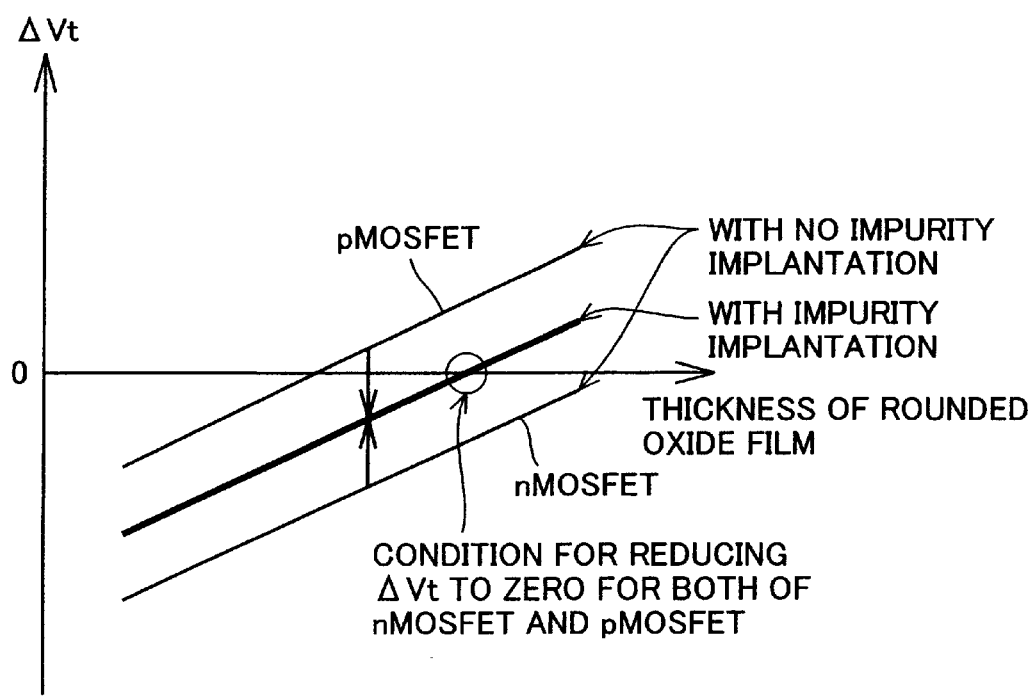
FIG. 12 is a graph showing the correlation between the thickness of the rounded oxide film and the quantity of fluctuation of the threshold voltage as well as the quantity of fluctuation of the threshold voltage following impurity implantation.

Referring to FIG. 11, the horizontal axis shows the thickness of the rounded oxide film 5, and the vertical axis plots the difference (ΔVt) between the threshold voltages. It is understood from FIG. 11 that the difference ΔVt is increased in proportion to the thickness of the rounded oxide film 5. This indicates that the difference ΔVt is increased when the radii of rounding of the upper corner portions 4a are increased. Referring to FIG. 11, the difference ΔVt in the nMOSFET is lower than that in the pMOSFET. This is because the difference ΔVt in the pMOSFET is not reduced by impurity diffusion while the difference ΔVt is reduced in the nMOSFET due to impurity diffusion of boron in the step 9.

In the state shown in FIG. 11, boron is ion-implanted in the step 3 according to this embodiment, thereby increasing the difference ΔVt in the nMOSFET while reducing that in the pMOSFET. Thus, the difference ΔVt in the nMOSFET is equalized with the difference ΔVt in the pMOSFET. According to this embodiment, conditions for reducing both of the difference ΔVt in the nMOSFET and the difference ΔVt in the pMOSFET to zero may be selected. A device having stable characteristics with no fluctuation of the threshold voltages in the upper corner portions 4a of the trench 4 can be fabricated by carrying out the rounding oxidation in the step 2, the impurity implantation in the step 3 and the heat treatment in the step 9 under these conditions.

While the fluctuation ΔVt of the threshold voltages is set to zero in this embodiment, the target value of the fluctuation ΔVt must be properly set in response to the performance values required to the device.

According to this embodiment, the threshold voltage in the upper corner portion 4a of the trench 4 for the nMOSFET is previously increased by the rounding oxidation and the ion implantation of boron, thereby canceling reduction of the threshold voltage of the upper corner portion 4a caused by impurity diffusion in the subsequent heat treatment. Thus, increase of a leakage current can be suppressed in the upper corner portion 4a of the trench 4 of the nMOSFET.

According to this embodiment, further, the threshold voltage in the upper corner portion 4a of the trench 4 of the pMOSFET is previously increased by rounding oxidation, thereby canceling reduction of the threshold voltage of the upper corner portion 4a caused by implantation of boron. Thus, increase of a leakage current can be suppressed in the upper corner portion 4a of the trench 4 of the pMOSFET.

Figure 3:
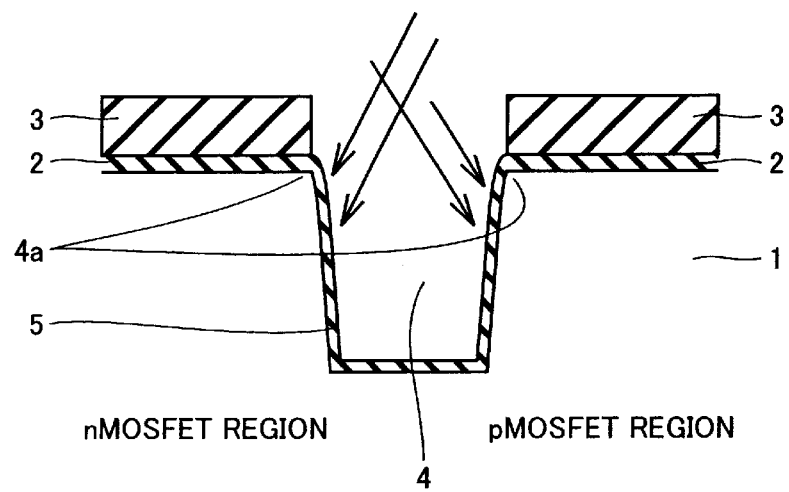
Figure 4:
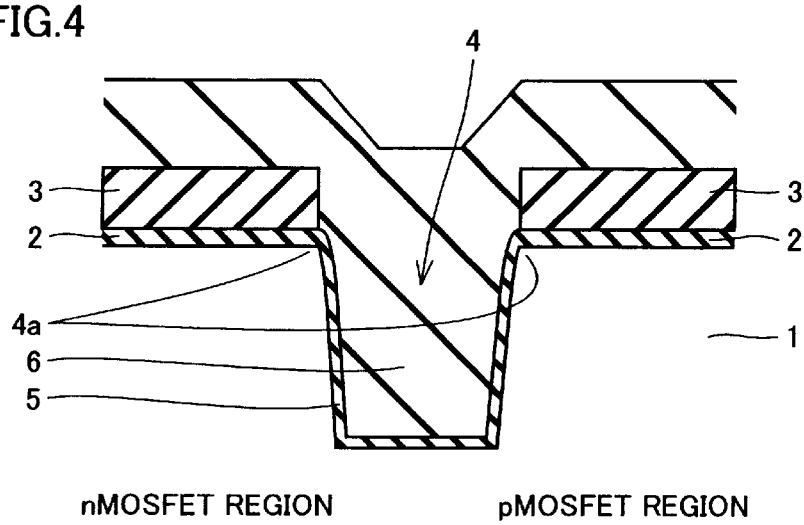
Figure 5:
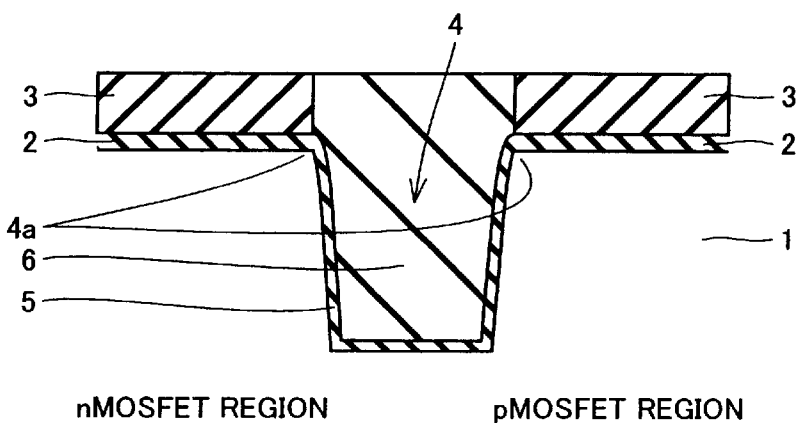

In the ion implantation step 3 shown in FIG. 3, boron is ion-implanted into both upper corner portions 4a of the trench 4 for the pMOSFET region and the nMOSFET region, whereby no ion implantation mask may be formed on the nMOSFET region or the pMOSFET region. Thus, no shade results from an ion implantation mask in the ion implantation step, whereby boron can be reliably implanted into both upper corner portions 4a. Consequently, reduction of the threshold voltages can be reliably suppressed in the upper corner portions 4a.

No ion implantation mask may be formed on the nMOSFET region or the pMOSFET in the step 3 of implanting boron, whereby the fabrication process can be simplified.

Although the present invention has been described and illustrated in detail, it is clearly understood that the same is by way of illustration and example only and is not to be taken by way of limitation, the spirit and scope of the present invention being limited only by the terms of the appended claims.

For example, while the p-type single-crystalline silicon substrate 1 is employed as the semiconductor substrate of the present invention in the aforementioned embodiment, the present invention is not restricted to this but a conductive substrate or a semiconductor layer formed on an insulating substrate such as a glass substrate can also be employed as the semiconductor substrate of the present invention. In other words, the present invention is also applicable to a thin-film transistor formed on a semiconductor layer formed on an insulating substrate or the like.

What is claimed is:

1. A method of fabricating a semiconductor device including a first transistor having a first conductivity type channel region and a second transistor having a second conductivity type channel region, comprising steps of:

forming a trench for isolating said first transistor and said second transistor from each other on a semiconductor substrate;

rounding upper corner portions of said trench by thermal oxidation;

introducing a first impurity into both said upper corner portions of said trench;

introducing a second impurity into a region for defining said first conductivity type channel region;

introducing a third impurity into a region for defining said second conductivity type channel region; and heat-treating said semiconductor substrate, wherein the method further comprises adjusting the rounding by thermal oxidation, introducing the first impurity and heat-treating such that:

at least a part of an increase in the threshold voltage of the first transistor due to the rounding and first impurity introduction is canceled by a decrease in the threshold during heat-treating; and at least a part of an increase in the threshold voltage of the second transistor due to rounding is cancelled by a decrease in the threshold voltage due to first impurity introduction.

2. The method of fabricating a semiconductor device according to claim 1, wherein said step of forming said trench includes steps of:

forming a first mask layer on a prescribed region of said semiconductor substrate, and forming said trench by etching said semiconductor substrate through said first mask layer serving as a mask, and said step of introducing said first impurity includes a step of introducing said first impurity into both said upper corner portions of said trench while leaving said first mask layer.

3. The method of fabricating a semiconductor device according to claim 2, wherein
said step of introducing said first impurity includes a step of implanting said first impurity into both said upper corner portions of said trench obliquely to the main surface of said semiconductor substrate while leaving said first mask layer.

4. The method of fabricating a semiconductor device according to claim 2, wherein
said first mask layer includes a silicon nitride film.

5. The method of fabricating a semiconductor device according to claim 1, wherein
said step of introducing said first impurity includes a step of implanting said first impurity into both said upper corner portions of said trench with implantation energy for locating a peak of impurity concentration in the vicinity of the surface of said semiconductor substrate.

6. The method of fabricating a semiconductor device according to claim 1, wherein
said first impurity introduced into both said upper corner portions of said trench includes boron.

7. The method of fabricating a semiconductor device according to claim 1, wherein
said step of forming said trench includes steps of:
forming a first mask layer on a prescribed region of said semiconductor substrate, and
forming said trench by etching said semiconductor substrate through said first mask layer serving as a mask,
said method further comprising a step of forming an insulator in said trench and on said semiconductor substrate and thereafter polishing the upper surface of said insulator through said first mask layer serving as a stopper thereby embedding said insulator in said trench.

8. The method of fabricating a semiconductor device according to claim 1, wherein
said step of heat-treating said semiconductor substrate includes a step of heat-treating said semiconductor substrate at a temperature of about 700° C. to about 1100° C.

9. The method of fabricating a semiconductor device according to claim 8, wherein
said step of heat-treating said semiconductor substrate includes a step of performing heat treatment by rapid heating.

10. The method of fabricating a semiconductor device according to claim 1, wherein
said step of rounding said upper corner portions of said trench includes a step of rounding said upper corner portions of said trench by forming a thermal oxide film of about 50 nm to about 600 nm at a temperature of about 1000° C. to about 1200° C.

11. The method of fabricating a semiconductor device according to claim 1, wherein
said second impurity includes boron, and
said third impurity includes arsenic or phosphorus.

12. The method of fabricating a semiconductor device according to claim 1, wherein
said step of introducing said second impurity into said region for defining said first conductivity type channel region includes steps of:
forming a second mask layer to cover a region formed with said second transistor having said second conductivity type channel region, and
implanting said second impurity into said region for defining said first conductivity channel region through said second mask layer serving as a mask.

13. The method of fabricating a semiconductor device according to claim 1, wherein
said step of introducing said third impurity into said region for defining said second conductivity type channel region includes steps of:
forming a third mask layer to cover a region formed with said first transistor having said first conductivity type channel region, and
implanting said third impurity into said region for defining said second conductivity type channel region through said third mask layer serving as a mask.

14. A method of fabricating a semiconductor device including a first transistor having a first conductivity type channel region and a second transistor having a second conductivity type channel region, comprising steps of:
successively depositing a silicon oxide film and a silicon nitride film on a semiconductor substrate;
forming a resist mask on a prescribed region of said silicon nitride film;
patterning said silicon nitride film and said silicon oxide film through said resist mask;
forming a trench for isolating said first transistor and said second transistor from each other by etching said semiconductor substrate through patterned said silicon nitride film serving as a mask;
rounding upper corner portions of said trench by thermal oxidation;
implanting a first impurity into both said upper corner portions of said trench through said silicon nitride film serving as a mask;
introducing a second impurity into a region for defining said first conductivity channel region;
introducing a third impurity into a region for defining said second conductivity type channel region; and
heat-treating said semiconductor substrate, wherein the method further comprises adjusting the rounding by thermal oxidation, introducing the first impurity and heat-treating such that:
at least a part of an increase in the threshold voltage of the first transistor due to the rounding and first impurity introduction is canceled by a decrease in the threshold during heat-treating; and
at least a part of an increase in the threshold voltage of the second transistor due to rounding is cancelled by a decrease in the threshold voltage due to first impurity introduction.

* * * * *